(12) United States Patent
Hanada et al.

(10) Patent No.: US 6,992,647 B2
(45) Date of Patent: Jan. 31, 2006

(54) ORGANIC EL DRIVE CIRCUIT AND ORGANIC EL DISPLAY DEVICE USING THE SAME

(75) Inventors: Kouichi Hanada, Kyoto (JP); Yuji Shimada, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 275 days.

(21) Appl. No.: 10/360,714

(22) Filed: Feb. 10, 2003

(65) Prior Publication Data

US 2003/0151567 A1     Aug. 14, 2003

(30) Foreign Application Priority Data

Feb. 14, 2002    (JP)    ............................. 2002-036236

(51) Int. Cl.
     *G09G 5/00*      (2006.01)

(52) U.S. Cl. ........................... 345/76; 345/214; 345/76; 315/169.1; 315/169.3

(58) Field of Classification Search ................. 345/76, 345/77, 84, 204, 214, 36, 45, 78; 315/169.1, 315/169.3
See application file for complete search history.

(56) References Cited

U.S. PATENT DOCUMENTS 6,586,888 B2 *   7/2003   Kitahara et al. ......... 315/169.1
6,747,417 B2 *   6/2004   Meade et al. ............ 315/169.3
6,756,738 B2 *   6/2004   Maede et al. ............ 315/169.1
6,777,885 B2 *   8/2004   Koyama ................... 315/169.1

FOREIGN PATENT DOCUMENTS

JP      2003-234655      8/2003

OTHER PUBLICATIONS

U.S. Appl. No. 10/102,621, filed Mar. 22, 2002, Kitahara et al.

* cited by examiner

*Primary Examiner*—Jimmy H. Nguyen
*Assistant Examiner*—Steven Holton
(74) *Attorney, Agent, or Firm*—Mattingly, Stanger, Malur & Brundidge, P.C.

(57) ABSTRACT

An input side drive current of a D/A converter circuit is controlled by a switch circuit connected in series with at least one of a plurality of input side transistors connected in parallel to form a current mirror connection. By turning the switch circuit from ON to OFF, a constant current flowing through the input side transistor, which is turned OFF by the switch circuit, is distributed to the remaining input side transistors, resulting in a large D/A converted current in a current mirror connected output side transistor. Thus, it is possible to correspondingly reduce a value of a display data, so that the number of bit positions of the D/A converter circuit can be reduced by 1 or more.

12 Claims, 3 Drawing Sheets

ORGANIC EL DRIVE CIRCUIT AND ORGANIC EL DISPLAY DEVICE USING THE SAME

BACKGROUND OF THE INVENTION

1. Field of the Invention

The present invention relates to an organic EL drive circuit and an organic EL display device using the same and, in particular, the present invention relates to an improvement of an organic EL drive circuit having a column line (anode side drive line of an organic EL element) current drive circuit for generating a pin drive current of an organic EL panel by generating a current corresponding to an input digital value by means of a D/A converter circuit utilizing a current mirror circuit, such that a D/A converted current exceeding the number of converted bits can be obtained and an area of the organic EL drive circuit can be reduced and an organic EL display device using the same organic EL drive circuit.

2. Description of the Prior Art

It has been known that an organic EL display device, which realizes a high luminance display by light generated by itself, is suitable for a display on a small display screen and the organic EL display device has been attracting public attention as the next generation display device to be mounted on a portable telephone set, a DVD player or a PDA (Personal Digital Assistants) such as a portable terminal device, etc. Known problems of the organic EL display device are that, when it is driven by voltage as in a liquid crystal display device, luminance variation thereof becomes substantial and that, since there is difference in sensitivity between R (red), G (green) and B (blue), a control of luminance of a color display becomes difficult.

In view of these problems, an organic EL display device using current drive circuits has been proposed recently. For example, JPH10-112391A discloses a technique with which the luminance variation problem is solved by employing a current drive system.

An organic EL display panel of an organic EL display device for a portable telephone set, having 396 (132 3) terminal pins for column lines and 162 terminal pins for row lines has been proposed. However, there is a tendency that the number of column lines as well as row lines is further increased.

An output stage of a current drive circuit of such organic EL display panel of the active matrix type or the simple matrix type includes a current source drive circuit, such as an output circuit constructed with a current mirror circuit for each of the terminal pins. A drive stage thereof includes a parallel-driven type current mirror circuit (reference current distribution circuit) having a plurality of output side transistors for each of the terminal pins as disclosed in JP2002-82662 (domestic priority application claiming priorities of JP2001-86967 and JP2001-396219) corresponding to U.S. patent application Ser. No. 10,102,671. In the disclosed drive stage, a plurality of mirror currents are generated correspondingly to the respective terminal pins by branching a reference current from a reference current generator circuit to thereby drive the output circuits. Alternatively, the mirror currents distributed to the respective terminal pins are amplified by respective k-time current amplifier circuits, where k is an integer not smaller than 2, and the output circuits are driven with the amplified currents. The k-time amplifier circuit is disclosed in JP2002-33719, in which D/A converter circuits are provided correspondingly to the respective terminal pins and the D/A converter circuit converts display data corresponding to the column side terminal pins into analog data to generate column side drive currents simultaneously.

In a liquid crystal display device, the display luminance can be manually regulated by means of variable resistors, etc. Such luminance regulation of an organic EL panel is usually performed by generating a reference current corresponding to an external luminance regulation signal on the side of a reference current generator circuit. In the case of the current drive circuit having the above mentioned D/A converter circuit, however, it is possible to regulate luminance by arithmetically operating values of display data according to a luminance set.

When the luminance is to be doubled, the luminance regulation by the D/A converter circuit is performed by setting display data with which the display luminance data D becomes D 2 in the D/A converter circuit and, when the luminance is to be a half, it is performed by setting the display luminance data D ½ in the D/A converter circuit.

FIG. 3 shows a column driver 1 of an organic EL drive circuit capable of regulating luminance, which is disclosed in JP2002-33719. A D/A converter circuit and a current mirror type current output circuit are depicted by reference numerals 2 and 3, respectively.

The D/A converter circuit 2 includes a diode-connected input side NPN bipolar transistor Qa supplied at its collector with current I from a constant current-mirror-connected output side NPN bipolar transistors Qb to Qn−1 and N channel MOS FETs Trb to Trn−1 connected between emitters of the output side transistors Qb to Qn−1 and ground GND as switch circuits. Gates of the transistors Trb to Trn−1 are connected to respective input terminals of the D/A converter circuit to which display data D0 to Dn−1 are supplied.

The output side transistors Qb to Qn−1 have collectors connected to an output terminal 2b and have emitter area ratio corresponding to weights 1, 2, 4, n for respective digits, respectively. Incidentally, an emitter of the input side transistor Qa is grounded through a series circuit of a resistor Ra and an N channel MOS FET Tra and a gate of the transistor Tra is connected to a power source line +VDD.

The D/A converter circuit 2 converts digital display data corresponding to display luminance and supplied from a processor such as CPU or MPU, etc., to the input terminals D0 to Dn−1 thereof into analog currents corresponding to the input data (display data) and outputs the analog currents at the output terminal 2b.

Incidentally, it should be noted that the output circuit of the reference current distribution circuit for each of the terminal pins of the drive stage is shown as the constant current source 14a. Further, transistors Trr and Qr constitute a base current supply circuit for supplying a base current to a common base line of the current-mirror-connection and an emitter of the transistor Qr is grounded through a series circuit of a resistor Rr and an N channel MOS FET Trra and a gate of the transistor Trra is connected to the power source line +VDD.

The current mirror type current output circuit 3 includes a drive stage current mirror circuit 3a and an output stage current mirror circuit 3b.

The current mirror circuit 3a is a peak current generator circuit and constructed with an NPN type input side transistor Qs and an output side transistor Qt, which are diode-connected. Emitters of these transistors Qs and Qt are connected to an input terminal 3c of the output stage current mirror circuit 3b through a P channel MOS FET Trs and an N channel MOS FET Trt, respectively.

A collector of the input side transistor Qs is connected to the output terminal 2b of the D/A converter circuit 2 and a collector of the output side transistor Qt is grounded. An emitter area ratio of the transistor Qs to the transistor Qt is 1:x. Assuming that an output current of the D/A converter circuit 2 is Ia, a drive current generated at the input terminal 3c becomes (x+1) Ia. Therefore, the current mirror circuit 3a generates (1+x) times drive current when the transistor Trt is in ON state. The transistor Trs is a load transistor provided correspondingly to the transistor Trt and has a gate grounded to balance the drive line. The transistor Trt becomes ON for a constant time period in an initial drive period by a control signal CONT.

The current mirror circuit 3a drives an input side transistor Qx of the output stage current mirror circuit 3b through current mirror transistors Qu and Qw, which are provided for base current correction. As a result, current (1+x) Ia flows through the input side transistor Qx for a constant time during which the transistor Trt is turned ON. Thereafter, the drive current Ia is outputted as a normal drive current.

There is a recent tendency that the number of drive pins is increasing due to requested high resolution. Since the peak current generator circuit and the D/A converter circuit are provided correspondingly to each of terminal pins for current driving the organic EL elements, the size of integrated circuit is increasing. Therefore, in order to reduce power consumption and reduce the area occupied by the integrated circuit, which is increased with increase of the number of drive pins, it is important to reduce the size of these circuits.

However, if the luminance regulation is performed by the D/A converter circuit, the display data is operated by a processor such as CPU or MPU, etc., correspondingly to a set luminance and then set. In such case, the number of bits to be converted into an analog value becomes 6 or 7, so that the number of bits required exceeds an original number of bits of display data by 1 or 2, which is required for luminance regulation. Therefore, the area occupied by the D/A converter circuit is increased.

Aside from such luminance regulation, in a case where a high definition color display is performed or a tone range of display is increased for a case of monochromatic display, the number of bits to be converted by the D/A converter circuit becomes large. However, in the organic EL drive circuit having the D/A converter circuit shown in FIG. 3 and provided for each terminal pin of the organic EL display panel, an increase of the number of bits to be converted leads to an increase of area occupied by the D/A converter circuit. Therefore, an influence on the increase of the area occupied by the current drive circuit of the organic EL panel is larger than that of other circuits.

SUMMARY OF THE INVENTION

An object of the present invention is to provide an organic EL drive circuit capable of obtaining a D/A converted current exceeding the number of bits to be converted into an analog value and capable of reducing an area occupied by an organic EL drive circuit.

Another object of the present invention is to provide an organic EL display device capable of reducing an area occupied by an organic EL drive circuit.

In order to achieve the above objects, a first aspect of the present invention resides in an organic EL drive circuit including a D/A converter circuit, the D/A converter circuit including a current mirror circuit having a plurality of output side transistors connected in parallel to form a current mirror connection and an input side transistor portion supplied with a predetermined drive current, the output side transistors being positioned corresponding to bit positions of display data and selectively operated corresponding to the display data inputted. The D/A converter circuit generates an analog output current corresponding to the display data at an output terminal, which is a total of currents of the output side transistors. The input side transistor portion includes a plurality of parallel input side transistors, a switch circuit connected in series with at least one of the plurality of the input side transistors, a current source for driving the plurality of the input side transistors with a predetermined constant current and a control portion for ON/OFF controlling the switch circuit. When the switch circuit is in ON state and the analog current from the D/A converter circuit exceeds a value corresponding to the number of bits of display data, which can be converted into analog data, the control portion turns the switch circuit OFF to generate a large analog current by setting display data having not larger than the number of bits, which can be converted into analog current.

As mentioned above, the input side drive current is controlled by the switch circuit connected in series with one of the input side transistors. By turning the switch circuit from ON to OFF, a portion of the constant current supplied to the input side transistors, which flows through the switch circuit, is blocked and distributed to the remaining input side transistors, so that a larger analog current is generated in the current-mirror connected output side transistors. Therefore, it becomes possible to reduce the number of bits of display data and to provide a D/A converter circuit having input terminal pins the number of which is reduced by 1 or more.

Consequently, the most significant bit position can be made correspondent to one or more bits exceeding the number of bits of the display data, which can be converted into analog current by the D/A converter circuit, so that the number of transistors can be substantially reduced compared with a case where input terminals corresponding to upper bits are provided in a D/A converter circuit.

As a result, it is possible to reduce the number of input terminals of the D/A converter circuit to thereby reduce the area occupied by the organic EL drive circuit.

Further, even in the case where the luminance regulation is performed by the D/A converter circuit, it becomes possible to regulate luminance by the display data, without increasing the number of input terminal pins of the D/A converter circuit correspondingly to the luminance regulation.

DESCRIPTION OF THE PREFERRED EMBODIMENTS

Figure 1:
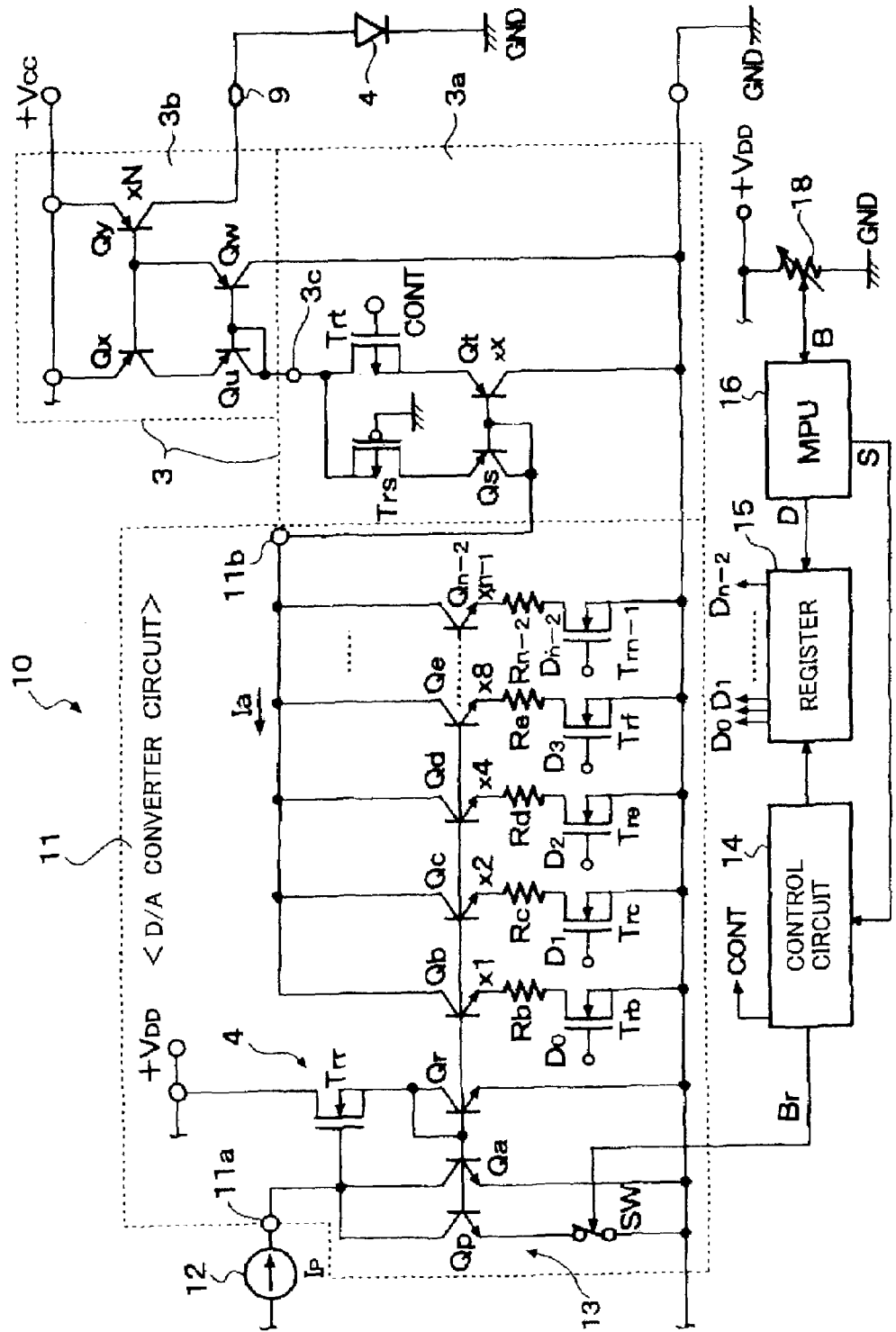
FIG. 1 is a block diagram of an organic EL drive circuit according to an embodiment of the present invention.
Figure 3:
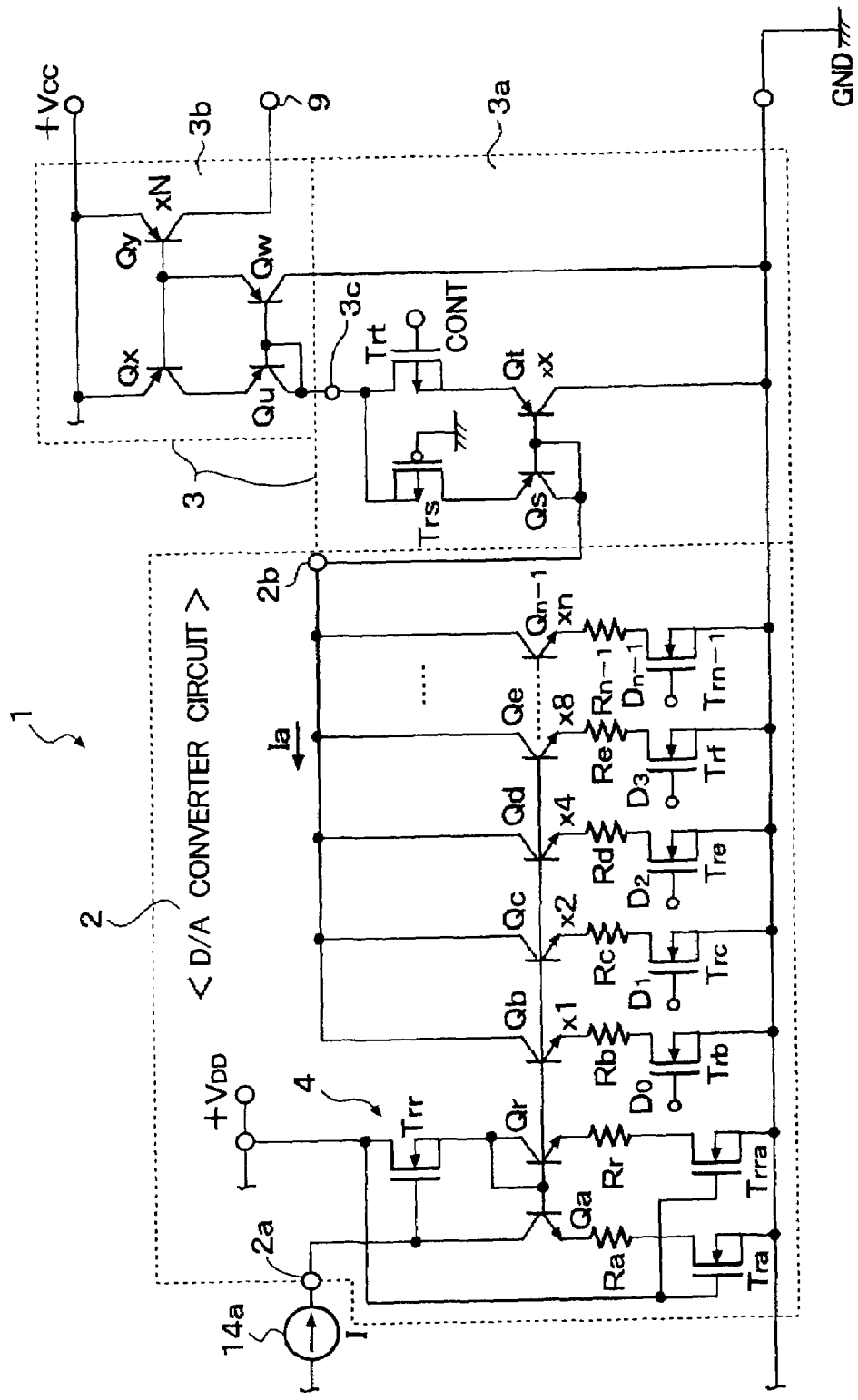
FIG. 3 is a circuit diagram of a prior art organic EL drive circuit.

In FIG.1, a column driver 10 of an organic EL drive circuit includes a D/A converter circuit 11, a constant current source 12 corresponding to a constant current source 14a shown in FIG. 3 as an output circuit for each terminal pin of a reference current distribution circuit, a luminance regulation circuit 13, a control circuit 14, a register 15 and an MPU 16.

The D/A converter circuit 11 corresponds to the D/A converter circuit 2 shown in FIG. 3. Although the D/A converter circuit 2 shown in FIG. 3 includes an input side transistor Qa, the D/A converter circuit 11 has a current mirror NPN input side transistor Qp connected in parallel to an input side transistor Qa. An emitter area ratio of the transistor Qa to the transistor Qp is 1:1 and an emitter of the transistor Qp is grounded through a switch circuit SW. The switch circuit SW is normally in ON state and is turned OFF upon a luminance control signal Br from the control circuit 14. The switch circuit SW and the transistor Qp constitute the luminance regulation circuit 13.

An output side current mirror circuit includes transistors Qb to Qn−2 and the transistor Qn−1 corresponding to the most significant bit shown in FIG. 3 is removed. Therefore, the number of the output side transistors of the D/A converter circuit 11 is smaller than that of the output side transistors shown in FIG. 3.

Figure 2:
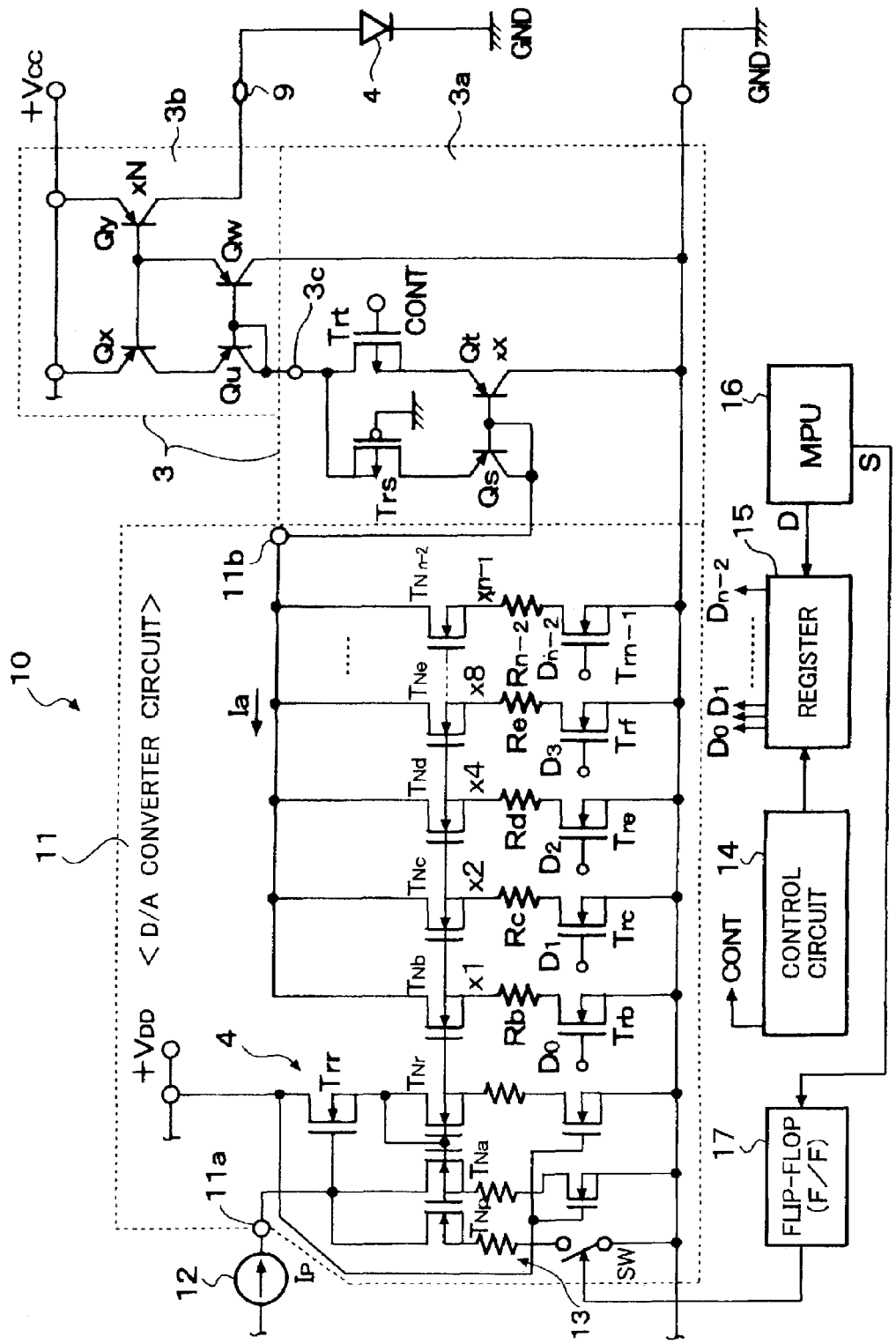
FIG. 2 is a block diagram of an organic EL drive circuit according to another embodiment of the present invention.

Although not shown in FIG. 1, the D/A converter circuit 11 may include a resistor connected between an N channel MOS FET as the switch circuit SW and the emitter of the transistor Qp, a series circuit of a resistor and an N channel MOS FET connected between the emitter of the transistor Qa and ground GND and a series circuit of a resistor and an N channel MOS FET connected between an emitter of the transistor Qr and ground GND, as shown in FIG. 3. With such circuit construction, it is possible to balance currents the output side transistors Qb to Qn−2 of the D/A converter circuit 11, so that more precise D/A conversion can be realized. FIG. 2 is a circuit diagram of the D/A converter circuit having the resistors and the MOS FETs.

In the case shown in FIG. 1, gates of the MOS FETs provided on the downstream sides of the respective transistors Qa and Qr are connected to a bias line such as a power source line +VDD as in the case shown in FIG. 2 or 3.

The input side transistors Qa and Qp are supplied with current Ip=2 I from the constant current source 12 through an input terminal 11a. That is, the constant current source 12 supplies a constant current twice the output current of the constant current source 14a shown in FIG. 3.

When the switch circuit SW is in ON state, current Ip/2 (=I) flows through each of the transistors Qa and Qp of the D/A converter circuit 11. This corresponds to the operation of the circuit shown in FIG. 3. In this case, the most significant bit of the display data set in this time, which corresponds to a terminal pin position of the transistor Qn−1 is 0 and the display data bits are inputted to the respective input terminals D0 to Dn−2 of the D/A converter circuit 11.

On the other hand, when the D/A converter circuit 11 receives the luminance control signal Br from the control circuit 14, the transistor Qp is turned OFF and current Ip=(2I) flows through the transistor Qa, where I is a current flowing through each of the transistors Qa and Qp when the transistor Qp is ON state. As a result, a current, which is twice that corresponding to the display data value D (D0 to Dn−2) set by the register 15 in the input terminals D0 to Dn−2, flows through the output side transistors Qb to Qn−2, respectively, and a drive current Ia, which is twice, is obtained at the output terminal 11b connected to the collectors of these transistors. In this case, the bit position of the input terminal Dn−2 corresponds to the bit position of the input terminal Dn−1 shown in FIG. 3.

Upon a luminance setting signal B regulated by a manually variable resister 18, etc., provided for regulating luminance of the organic EL panel, the MPU 16 arithmetically operates the display data and, when data bit value of the display data D is a predetermined value M, which corresponds to a case where the most significant bit corresponding to the position of the transistor Qn−1 is "1" and the remaining bits are "0", that is, the display data is "1000 . . . 000", or larger, the MPU 16 divides the display data value D by 2. That is, the display data value D/2 is generated by shifting the display data down by one bit and is set in the register 15 as data of the input terminals D0 to Dn−2. A program for performing this processing is stored in the MPU 16. Thus, the data of the input terminal Dn−1 is shifted to the input terminal Dn−2 and set therein. Since the most significant bit is "1", the transistor Qn−2 is turned ON. Simultaneously therewith, the MPU 16 sends a control signal S to the control circuit 14 according to the most significant bit "1" to generate the luminance control signal Br thereby. Therefore, since, even when the display data value D/2 is set in the input terminal 11a, the transistor Qp is kept in OFF state and the doubled currents flow the output transistors Qb to Qn−2 and so the D/A converter circuit 11 generates an output current, which is doubled for display data value of ½ when the display data value exceeds the predetermined value M. As a result, the output current corresponding to the display data value D to be generated is provided at the output terminal 11b.

Incidentally, the predetermined value M (="1000 . . . 000") corresponds to the analog current value when the analog current value converted by the D/A converter circuit 11 exceeds the number of bits D0 to Dn−2 of the display data capable of being converted into analog values by the D/A converter circuit. The current value corresponding to the least significant bit is negligibly small. When the result of operation of the display data, which is performed by the MPU 16, becomes larger than the predetermined value M, the luminance setting signal B corresponds to high luminance. Therefore, there is almost no problem even if the least significant bit is neglected.

FIG. 2 shows another embodiment of the present invention. In this embodiment, a flip-flop (FF) 17 is provided and the most significant bit Dn−1 as the control signal S is set in the flip-flop 17 from MPU 16 to ON/OFF control the switch SW correspondingly to an output of the flip-flop 17 instead of the luminance control signal Br from the control circuit 14. The switch SW is turned ON when the flip-flop 17 is set as "1" by the control signal S from the MPU 16 and turned OFF when the flip-flop 17 is reset by the control signal S. In this case, the control signal S assigns the most significant bit of the display data D.

The D/A converter circuit shown in FIG. 2 has a MOS transistor construction including, instead of the bipolar transistors Qa, Qp and Qb to Qn−2 shown in FIG. 1, MOS transistors TNa, TNp and TNb to TNn−2.

With this D/A converter circuit, the digital to analog conversion is realized regardless of the luminance setting signal B by turning the switch SW ON when the display data value exceeds the predetermined value M. That is, the most significant bit Dn−1 of the display data in FIG. 3 is set in the flip-flop 17 as it is and the display data D/2 is set in the register 15, which generates the data bits D0 to Dn−2 of the display data D, when the display data value D exceeds the predetermined value M, so that the display data D is set in the D/A converter circuit.

Alternatively, it may be possible to provide a memory position for the most significant bit Dn−1 in not the flip-flop 17 but the register 15 so that the whole display data is set in the register.

As is clear from the foregoing description, the D/A converter circuit 11 does not have the transistor Qn−1, which has the emitter area ratio n and corresponds to the most significant bit.

Since a value of current flowing through each transistor is as small as in the order of microampere, each of transistors, which is formed as a cell, is capable of flowing a current several tens times the current value even when its emitter area ratio is 1. When a minute current is generated, an output side transistor Q of a current mirror circuit, which has an emitter area ratio n, is usually obtained by connecting n transistors Q each having emitter area ratio 1 in parallel. Therefore, in the described case, one of the n transistors Q, to which the most significant bit is assigned, can removed by merely adding a single transistor Q to the input side of the D/A converter circuit.

Thus, the number of transistors used in the D/A converter circuit can be substantially reduced.

Although two transistors are provided in the input side of the D/A converter circuit having the current mirror construction in the described embodiments, the number of transistors may be three or more. Further, the emitter area ratios thereof are not always equal.

Further, although the ON/OFF control of the switch circuit connected to one of the two transistors in the input side of the D/A converter circuit is performed by the control signal from the control circuit, such control may be performed directly from the MPU side through a bus.

Further, the NPN (or N channel) type transistors in the described embodiments may be substituted by PNP (or P channel) type transistors and the PNP (or P channel) type transistors may be substituted by NPN (or N channel) type transistors. In the latter case, the power source voltage should be negative and the transistors provided upstream side should be provided downstream side.

What is claimed is:

1. An organic electroluminescent (EL) drive circuit having a digital-to-analog (D/A) converter circuit including a current mirror circuit having an input side transistor portion supplied with a predetermined drive current and a plurality of output side transistors connected in parallel to form a current mirror connection, said output side transistors selectively operating correspondingly to a display data inputted correspondingly to bit positions of the display data to generate an analog current corresponding to the display data in an output terminal of said D/A converter circuit as a total of currents flowing through said output side transistors, said organic EL drive circuit comprising:
   a plurality of parallel connected input side transistors provided in said input side transistor portion;
   a switch circuit connected in series with at least one of said input side transistors;
   a current source for driving said input side transistors with a predetermined constant current; and
   a control portion for ON/OFF controlling said switch circuit, wherein, when said switch circuit is in ON stage and a value of the analog current from said D/A converter circuit becomes larger than that corresponding to the number of bits of the display data, which can be converted into analog current value, said control portion turns said switch circuit OFF to set the display data corresponding to the number of the bits in said D/A converter circuit to thereby generate the large analog current value corresponding to one or more bits exceeding the number of bits of the display data.

2. An organic EL drive circuit as claimed in claim 1, wherein said input side transistor portion includes two input side transistors having operating current ratio of 1:1 and, when said switch circuit is turned OFF, said control portion sets a display data having a value which is a half of the display data value corresponding to the large analog current value in said D/A converter circuit.

3. An organic EL drive circuit as claimed in claim 2, wherein said control portion calculates the display data correspondingly to regulation of display luminance of said organic EL panel and, when the calculated display data exceeds the number of the bits, turns said switch circuit OFF.

4. An organic EL drive circuit as claimed in claim 3, wherein said current source is one of output circuits, which corresponds to one of said terminal pins, of a circuit for distributing a reference current to said terminal pins, said switch circuit is provided downstream of said input side transistor and said control portion includes a processor, a control circuit and a register, the display data being calculated by said processor and set in said register.

5. An organic EL drive circuit as claimed in claim 4, wherein said processor turns said switch circuit OFF through said control circuit.

6. An organic EL drive circuit as claimed in claim 2, wherein said control portion includes a memory circuit for storing an information for setting said switch circuit OFF and said switch circuit is turned OFF by a predetermined information stored in said memory circuit.

7. An organic electroluminescent (EL) display device comprising:
   an organic EL display panel;
   a digital-to-analog (D/A) converter circuit including a current mirror type current output circuit for outputting currents to terminal pins of said organic EL display panel and a current mirror circuit having a plurality of output side transistors connected in parallel to form a current mirror connection and a plurality of input side transistors driven with a predetermined drive current, the plurality of said output side transistors corresponding to bit positions of a display data, respectively, said D/A converter circuit selectively operating correspondingly to the input display data to drive said current mirror type current output circuit by generating an analog current corresponding to the display data as a total of currents flowing through said output side transistors;
   a switch circuit connected in series with at least one of the plurality of said input side transistors;
   a current source for driving the plurality of said input side transistors with a predetermined constant current; and
   a control portion for ON/OFF controlling said switch circuit, wherein, when said switch circuit is in ON stage and a value of the analog current from said D/A converter circuit becomes larger than that corresponding to the number of bits of the display data, which can be converted into analog current value, said control portion turns said switch circuit OFF to set the display data corresponding to the number of the bits in said D/A converter circuit to thereby generate the large analog current value corresponding to one or more bits exceeding the number of bits of the display data.

8. An organic EL display device as claimed in claim 7, wherein said input side transistor portion includes two input side transistors having operating current ratio of 1:1 and, when said switch circuit is turned OFF, said control portion sets a display data having a value which is a half of the display data value corresponding to the large analog current value in said D/A converter circuit.

9. An organic EL display device as claimed in claim 8, wherein said control portion calculates the display data correspondingly to regulation of display luminance of said organic EL panel and, when the calculated display data exceeds the number of the bits, turns said switch circuit OFF.

10. An organic EL display device as claimed in claim 9, wherein said current source is one of output circuits, which corresponds to one of said terminal pins, of a circuit for distributing a reference current to said terminal pins, said switch circuit is provided downstream of said input side transistor and said control portion includes a processor, a control circuit and a register, the display data being calculated by said processor and set in said register.

11. An organic EL display device as claimed in claim 10, wherein said processor turns said switch circuit OFF through said control circuit.

12. An organic EL display device as claimed in claim 8, wherein said control portion includes a memory circuit for storing an information for setting said switch circuit OFF and said switch circuit is turned OFF by a predetermined information stored in said memory circuit.

* * * * *